United States Patent
Lee

(10) Patent No.: US 9,577,097 B2
(45) Date of Patent: Feb. 21, 2017

(54) SEMICONDUCTOR DEVICE HAVING STRESSOR AND METHOD OF FORMING THE SAME

(71) Applicant: SAMSUNG ELECTRONICS CO., LTD., Suwon-si, Gyeonggi-Do (KR)

(72) Inventor: Jaehoon Lee, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/806,782

(22) Filed: Jul. 23, 2015

(65) Prior Publication Data

US 2016/0163860 A1    Jun. 9, 2016

(30) Foreign Application Priority Data

Dec. 8, 2014  (KR) .................. 10-2014-0175086

(51) Int. Cl.
| | | |
|---|---|---|
| H01L 29/78 | (2006.01) | |
| H01L 29/737 | (2006.01) | |
| H01L 29/165 | (2006.01) | |
| H01L 29/66 | (2006.01) | |
| H01L 29/267 | (2006.01) | |
| H01L 29/417 | (2006.01) | |
| H01L 29/51 | (2006.01) | |

(52) U.S. Cl.
CPC ........ H01L 29/7848 (2013.01); H01L 29/165 (2013.01); H01L 29/66545 (2013.01); H01L 29/66628 (2013.01); H01L 29/66636 (2013.01); H01L 29/7378 (2013.01); *H01L 29/267* (2013.01); *H01L 29/41783* (2013.01); *H01L 29/517* (2013.01)

(58) Field of Classification Search
CPC . H01L 29/7848; H01L 29/165; H01L 29/205; H01L 29/267; H01L 29/1054; H01L 29/7378; H01L 29/7847; H01L 21/027; H01L 21/02293; H01L 21/20; H01L 21/2022; H01L 29/41783; H01L 29/517; H01L 29/66545; H01L 29/66628; H01L 29/66636; H02L 29/7842

See application file for complete search history.

(56) References Cited

U.S. PATENT DOCUMENTS

| | | |
|---|---|---|
| 7,679,133 B2 | 3/2010 | Son et al. |
| 7,759,199 B2 | 7/2010 | Thomas et al. |

(Continued)

FOREIGN PATENT DOCUMENTS

| | | |
|---|---|---|
| JP | 2008-177319 | 7/2008 |
| JP | 2011-066042 | 3/2011 |
| WO | 2011033695 | 3/2011 |

*Primary Examiner* — Galina Yushina
(74) *Attorney, Agent, or Firm* — F. Chau & Associates, LLC

(57) ABSTRACT

A semiconductor device having a stressor is provided. A first trench and a second trench spaced apart from each other are formed in a substrate. A channel area is defined between the first trench and the second trench. A gate dielectric layer is formed on the channel area. A gate electrode is formed on the gate dielectric layer. The stressor includes a plurality of semiconductor layers formed in the first trench and the second trench and a plurality of interlayers formed between the semiconductor layers. Sidewalls of the first trench and the second trench are v-shaped (e.g., have a < or > shape).

21 Claims, 14 Drawing Sheets

(56) References Cited

U.S. PATENT DOCUMENTS

| | | |
|---|---|---|
| 7,816,766 B2 | 10/2010 | Tamura et al. |
| 7,939,413 B2 | 5/2011 | Chong et al. |
| 8,168,505 B2 | 5/2012 | Yang et al. |
| 8,553,466 B2 | 10/2013 | Han et al. |
| 8,559,235 B2 | 10/2013 | Yoon et al. |
| 8,654,587 B2 | 2/2014 | Yoon et al. |
| 2008/0001182 A1* | 1/2008 | Chen ............... H01L 21/823807 257/255 |
| 2008/0185612 A1* | 8/2008 | Fukuda ............. H01L 21/02381 257/190 |
| 2011/0223752 A1* | 9/2011 | Hing ................... H01L 29/6653 438/585 |
| 2011/0233648 A1 | 9/2011 | Seol et al. |
| 2013/0109144 A1* | 5/2013 | Kim .................. H01L 21/02532 438/301 |
| 2014/0199813 A1* | 7/2014 | Clifton ............. H01L 29/66477 438/151 |
| 2014/0361339 A1* | 12/2014 | Liu ..................... H01L 29/7848 257/192 |
| 2015/0088803 A1* | 3/2015 | Moroz ................ G06F 17/5045 706/52 |

* cited by examiner

SEMICONDUCTOR DEVICE HAVING STRESSOR AND METHOD OF FORMING THE SAME

CROSS-REFERENCE TO RELATED APPLICATION

This application claims priority under 35 U.S.C. §119 to Korean Patent Application No. 10-2014-0175086 filed on Dec. 8, 2014, the disclosure of which is incorporated by reference in its entirety herein.

BACKGROUND

Technical Field

Embodiments of the inventive concept relate to a semiconductor device having a stressor.

Discussion of Related Art

In a field-effect transistor (FET), the drain-to-source current flows via a conducting channel that connects the source region to the drain region. The conductivity is varied by the electric field that is produced when a voltage is applied between the gate and source terminals. A metal-oxide-semiconductor FET (MOSFET) is a type of FET used for amplifying or switching electronic signals.

Performance of a transistor may be improved by increasing a carrier mobility inside a channel area of the channel of the transistor. A technique of forming stressors at both sides of the channel area has been tried to increase mobility. However, the stressors are vulnerable to cracking or other defects due to differences in a thermal expansion coefficient and a lattice constant. The thermal expansion coefficient describes the relative change in length of a material per degree of temperature change. The lattice constant refers to the physical dimension of unit cells in a crystal lattice. Cracks in a stressor of a transistor may cause a decrease in the tensile strength of the stressor, and cause a leakage current in the transistor.

SUMMARY

At least one embodiment of the inventive concept provides a semiconductor device having improved electrical characteristics.

At least one exemplary embodiment of the inventive concept provides a method of forming a semiconductor device having improved electrical characteristics.

A semiconductor according to an exemplary embodiment of the inventive concept is provided. The semiconductor device includes a substrate having a first trench and a second trench spaced apart from each other in the substrate. A channel area is defined between the first trench and the second trench. A gate dielectric layer is formed on the channel area. A gate electrode is formed on the gate dielectric layer. A stressor including a plurality of semiconductor layers formed in the first trench and the second trench and a plurality of interlayers formed between the semiconductor layers is formed. Sidewalls of the first trench and the second trench are v-shaped (e.g., < or > shape).

The gate dielectric layer may be in contact with a bottom or a sidewall of the gate electrode, and an upper end of the gate dielectric layer may be formed at a higher level than a center of the gate electrode.

The interlayers may include a pseudomorphic monolayer, a pseudomorphic multilayer, a pseudomorphic dot-like structure, or a combination thereof, having a different bandgap from the semiconductor layers.

The interlayers may include SiN, SiO, CN, SiCN, GaN, AlN, InN, GaAs, SiC, Ge, Si, a Si/Ge superlattice, or a combination thereof.

The stressor may include a first semiconductor layer in contact with the sidewalls of the first trench and the second trench. A first interlayer may be formed on the first semiconductor layer. A second semiconductor layer may be formed on the first interlayer. A second interlayer may be formed on the second semiconductor layer. A third semiconductor layer may be formed on the second interlayer.

Sidewalls of the first semiconductor layer and the first interlayer may have a v-shape (e.g., < or > shape).

The first interlayer may be thinner than the first semiconductor layer.

The first interlayer may have a thickness in the range of 0.1 nm to 10 nm.

The second semiconductor layer may be thicker than the first semiconductor layer.

The semiconductor layers may include SiGe. A content of Ge in the semiconductor layers may be in the range of 20% to 80%.

A content of Ge in the second semiconductor layers may be higher than that in the first semiconductor layer.

A capping layer formed at a higher level than the channel area may be formed on the stressor.

A lower end of the capping layer may be formed at a higher level than an upper end of the stressor.

The capping layer may include a metal silicide, Si, or a combination thereof.

A first spacer may be formed on a side surface of the gate electrode. A second spacer may be formed on the first spacer. The second spacer may be in contact with an upper surface of the capping layer.

A bottom of the first spacer may be in contact with the stressor. A side surface of the first spacer may be in contact with the capping layer.

A lower end of the second spacer may be in contact with the upper surface of the capping layer.

The semiconductor layers may include crystal growth SiGe.

A semiconductor device according to an exemplary embodiment of the inventive concept is provided. The semiconductor device includes a first trench and a second trench spaced apart from each other in a substrate. A channel area is defined between the first trench and the second trench. A first gate dielectric layer is formed on the channel area. A second gate dielectric layer is formed on the first gate dielectric layer. A gate electrode is formed on the second gate dielectric layer. A stressor including a plurality of semiconductor layers formed in the first trench and the second trench and interlayers formed between the semiconductor layers is formed. The second gate dielectric layer is in contact with a bottom and a sidewall of the gate electrode. An upper end of the second gate dielectric layer is formed at a higher level than a center of the gate electrode.

According to an exemplary embodiment of the inventive concept, a semiconductor device includes a substrate having a first trench and a second trench spaced apart from each other in the substrate, and a channel area defined between the trenches, a gate dielectric layer disposed on the channel area, a gate electrode disposed on the gate dielectric layer, and a stressor including a plurality of semiconductor layers formed in the first trench and the second trench and a plurality of interlayers formed between the semiconductor layers. The interlayers have bandgaps different from the semiconductor layers. The interlayers having bandgaps different from the semiconductor layers and a cross-section of one of the semiconductor layers has a trapezoidal shape.

A cross-section of one of the interlayers may have a hexagonal shape.

According to an exemplary embodiment of the inventive concept, a semiconductor device includes a substrate having a first trench and a second trench spaced apart from each other in the substrate, and a channel area defined between the trenches, a gate dielectric layer disposed on the channel area, a gate electrode disposed on the gate dielectric layer, and a stressor including a plurality of semiconductor layers formed in the first trench and the second trench and a plurality of interlayers formed between the semiconductor layers. The interlayers have bandgaps different from the semiconductor layers, each sidewall of the stressor includes a pair of edges that form a non-straight angle, and each of the interlayers has a concave shape.

A bottom side of an uppermost one of the semiconductor layers may have a convex shape.

BRIEF DESCRIPTION OF THE DRAWINGS

The inventive concept will become more apparent by describing in detail exemplary embodiments thereof with reference to the attached drawings, in which like reference numerals denote the same respective parts throughout the different views. In the drawings.

DETAILED DESCRIPTION

Figure 1:
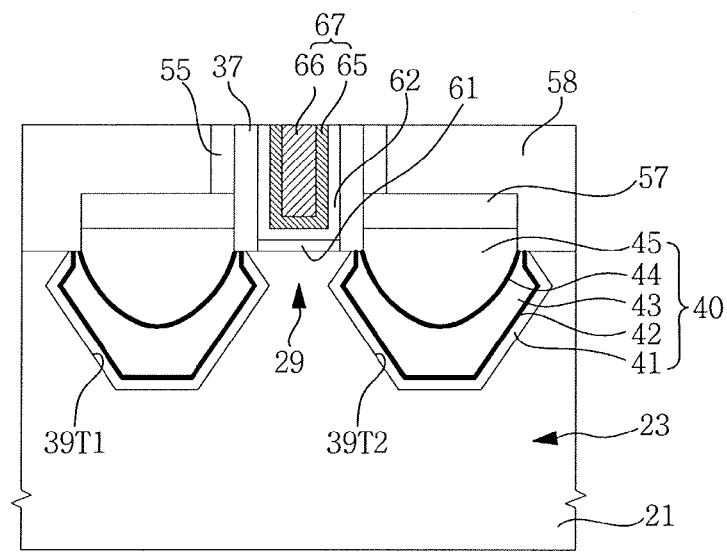
FIGS. 1 to 10 are cross-sectional views for describing semiconductor devices according to exemplary embodiments of the inventive concept.

The inventive concept will now be described more fully with reference to the accompanying drawings in which some exemplary embodiments are shown. The inventive concepts may, however, be embodied in different forms and should not be construed as limited to the embodiments set forth herein. Rather, these embodiments are provided so that this disclosure is thorough and complete and fully conveys the inventive concept to those skilled in the art. Accordingly, all such modifications are intended to be included within the scope of this inventive concept.

As used herein, the singular forms "a," "an" and "the" are intended to include the plural forms as well, unless the context clearly indicates otherwise. It will be understood that when an element or layer is referred to as being "on," "connected to," or "coupled to" another element or layer, it can be directly on, connected to, or coupled to the other element or layer or intervening elements or layers may be present.

Embodiments of the inventive concept are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, may occur. Thus, embodiments should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to limit the scope of the present inventive concept.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. No. 2011/0233648.

FIGS. 1 to 10 are cross-sectional views for describing semiconductor devices according to exemplary embodiments of the inventive concept.

Referring to FIG. 1, an active region 23, trenches 39T1 and 39T2, and a channel area 29, a stressor 40, a capping layer 57, a lower insulating layer 58, a first gate dielectric layer 61, a second gate dielectric layer 62, a gate electrode 67, a first spacer 37, and a second spacer 55 are formed on a substrate 21. In an exemplary embodiment, the stressor 40 is a physical object that has sufficient tensile strength to prevent cracks from developing in one or more layers that make up the physical object.

The trenches 39T1 and 39T2 include a first trench 39T1 and a second trench 39T2. The channel area 29 is defined between the first trench 39T1 and the second trench 39T2. In an exemplary embodiment, sidewalls of the first trench 39T1 and the second trench 39T2 have a < or > shape. For example, the sidewalls may be shaped like a less than symbol, shaped like a greater than symbol, V-shaped (e.g., sideways), C-shaped, or chevron-shaped. In an exemplary embodiment, the sidewalls of the trenches 39T1 and 39T2 have two straight or substantially straight edges connected together to form a non-straight angle (e.g., acute, right, obtuse, etc.). The length of the edges may be the same or different from one another. Sidewalls of the trenches 39T1 and 39T2 may be interpreted as having a convergence interface.

The stressor 40 includes a first semiconductor layer 41, a first interlayer 42, a second semiconductor layer 43, a second interlayer 44, and a third semiconductor layer 45. In an exemplary embodiment, the stressor 40 fully fills the trenches 39T1 and 39T2 and protrudes to a higher level than an upper end of the channel area 29.

In an exemplary embodiment, the first semiconductor layer 41 is conformally formed on an inner wall of the trenches 39T1 and 39T2. In an exemplary embodiment, a side surface of the first semiconductor layer 41 has a < or > shape. For example, the side surface may be shaped like a less than symbol, shaped like a greater than symbol, V-shaped (e.g., sideways), C-shaped, or chevron-shaped. In an exemplary embodiment, the side surface includes two straight or substantially edges connected together to form the above-described angle. The length of the edges may be the same or different from one another. In an exemplary embodiment, the first semiconductor layer 41 includes a crystal growth material. For example, the first semiconductor layer 41 may be formed using a selective epitaxial growth (SEG) method. In an exemplary embodiment, the first semiconductor layer 41 includes a different material from the channel area 29. In an exemplary embodiment, the first semiconductor layer 41 includes a different element from the channel area 29. In an exemplary embodiment, the first semiconductor layer 41 includes a material having a different lattice constant from the channel area 29. For example, the first semiconductor layer 41 may include a material having a greater lattice constant than the channel area 29. In an exemplary embodiment, the first semiconductor layer 41 includes undoped silicon-germanium SiGe formed by an SEG method. In an exemplary embodiment, a content of Ge in the first semiconductor layer 41 is in the range of 20% to 80%. In an exemplary embodiment, the content of Ge in the first semiconductor layer 41 is in the range of 20% to 30%.

The second semiconductor layer 43 is formed on the first interlayer 42. In an exemplary embodiment, the second semiconductor layer 43 directly contacts the first interlayer 42. In an exemplary embodiment, an upper surface of the second semiconductor layer 43 has a concave shape. In an exemplary embodiment, the second semiconductor layer 43 is thicker than the first semiconductor layer 41. In an exemplary embodiment, the second semiconductor layer 43 includes a crystal growth material. For example, the second semiconductor layer 43 may be formed by an SEG method. In an exemplary embodiment, the second semiconductor layer 43 includes a different material from the channel area 29. In an exemplary embodiment, the second semiconductor layer 43 includes a different element from the channel area 29. In an exemplary embodiment, the second semiconductor layer 43 includes a material having a different lattice constant from the channel area 29. For example, the second semiconductor layer 43 may include a material having a greater lattice constant than the channel area 29.

In an exemplary embodiment, the second semiconductor layer 43 includes boron (B)-doped SiGe formed using an SEG process. In an exemplary embodiment, a content of Ge in the second semiconductor layer 43 is higher than that in the first semiconductor layer 41. In an exemplary embodiment, the content of Ge in the second semiconductor layer 43 is in the range of 20% to 80%. For example, the content of Ge in the second semiconductor layer 43 may be in the range of 30% to 50%.

The third semiconductor layer 45 is formed on the second interlayer 44. In an exemplary embodiment, the third semiconductor layer 45 directly contacts the second interlayer 44. In an exemplary embodiment, the third semiconductor layer 45 is thicker than the second semiconductor layer 43. In an exemplary embodiment, the third semiconductor layer 45 fully fills the trenches 39T1 and 39T2 and protrudes from the trenches 39T1 and 39T2. In an exemplary embodiment, an upper end of the third semiconductor layer 45 is formed at a higher level than an upper end of the channel area 29. In an exemplary embodiment, the third semiconductor layer 45 contacts a side surface of the first spacer 37. In an exemplary embodiment, the third semiconductor layer 45 includes a crystal growth material. For example, the third semiconductor layer 45 may be formed by an SEG method. In an exemplary embodiment, the third semiconductor layer 45 includes a different material from the channel area 29. In an exemplary embodiment, the third semiconductor layer 45 includes a different element from the channel area 29. In an exemplary embodiment, the third semiconductor layer 45 includes a material having a different lattice constant from the channel area 29. For example, the third semiconductor layer 45 may include a material having a greater lattice constant than the channel area 29.

In an exemplary embodiment, the third semiconductor layer 45 includes B-doped SiGe formed by an SEG process. In an exemplary embodiment, a content of Ge in the third semiconductor layer 45 is higher than that in the first semiconductor layer 41. In an exemplary embodiment, the content of Ge in the third semiconductor layer 45 is higher than that in the first semiconductor layer 41 and that in the second semiconductor layer 43. In an exemplary embodiment, the content of Ge in the third semiconductor layer 45 is in the range of 20% to 80%. For example, the content of Ge in the third semiconductor layer 45 may be in the range of 30% to 50%.

The first interlayer 42 is formed between the first semiconductor layer 41 and the second semiconductor layer 43. In an exemplary embodiment, the first interlayer 42 is conformally formed on surfaces of the first semiconductor layer 41. In an exemplary embodiment, a side surface of the first interlayer 42 has a < or > shape. For example, the side surface may be shaped like a less than symbol, shaped like a greater than symbol, V-shaped (e.g., sideways), C-shaped, or chevron-shaped. In an exemplary embodiment, the side surface includes a shape with straight or substantially straight edges connected together to form the above-described angle. The length of the two edges may be the same or different from one another. In an exemplary embodiment, the first interlayer 42 is thinner than the first semiconductor layer 41. In an exemplary embodiment, the first interlayer 42 has a thickness in the range of 0.1 nm to 10 nm. For example, the first interlayer 42 may have a thickness in the range of 1 nm to 2 nm.

In an exemplary embodiment, the first interlayer 42 includes a different material from the first semiconductor layer 41. In an exemplary embodiment, the first interlayer 42 includes a different element from the first semiconductor layer 41. The first interlayer 42 may include a pseudomorphic monolayer, a pseudomorphic multilayer, a pseudomorphic dot-like structure, or a combination thereof, having a different bandgap from the first semiconductor layer 41. A bandgap refers to the energy difference (e.g., in electron volts) between the top valence band and the bottom of the conduction band in insulators and semiconductors. For example, materials with large bandgaps are generally insulators, those with smaller bandgaps are semiconductors, and those with small or no bandgap are conductors. The first interlayer 42 may include SiN, SiO, CN, SiCN, GaN, AlN, InN, GaAs, SiC, Ge, Si, a Si/Ge superlattice, or a combination thereof. The Si/Ge superlattice may include a structure in which silicon layers and Ge layers are alternately grown in two to 100 layers.

The second interlayer 44 is interposed between the second semiconductor layer 43 and the third semiconductor layer 45. The second interlayer 44 may have a similar configuration as the first interlayer 42. In an exemplary embodiment, the second interlayer 44 is conformally formed on surfaces of the second semiconductor layer 43. In an exemplary embodiment, the second interlayer 44 is thinner than the second semiconductor layer 43. In an exemplary embodiment, the second interlayer 44 has a thickness in the range of 0.1 nm to 10 nm. For example, the second interlayer 44 may have a thickness in the range of 1 nm to 2 nm.

In an exemplary embodiment, the second interlayer 44 includes a different material from the second semiconductor layer 43. In an exemplary embodiment, the second interlayer 44 includes a different element from the second semiconductor layer 43. The second interlayer 44 may include a pseudomorphic monolayer, a pseudomorphic multilayer, a pseudomorphic dot-like structure, or a combination thereof, having a different bandgap from the second semiconductor layer 43. The second interlayer 44 may include SiN, SiO, CN, SiCN, GaN, AlN, InN, GaAs, SiC, Ge, Si, a Si/Ge superlattice, or a combination thereof. The Si/Ge superlattice may include a structure in which silicon layers and Ge layers are alternately grown in two to 100 layers. In an exemplary embodiment, the second interlayer 44 includes a crystal growth material.

The capping layer 57 is formed on the stressor 40. The capping layer 57 contacts a side surface of the first spacer 37 and a bottom of the second spacer 55. The capping layer 57 may include Si, SiGe, a metal silicide, or a combination thereof. The capping layer 57 may be interpreted as an ohmic layer.

The first spacer 37 is formed on a side surface of the gate electrode 67. The second spacer 55 is formed on an outer side of the first spacer 37. A bottom of the first spacer 37 contacts the stressor 40. The side surface of the first spacer 37 contacts the stressor 40 and the capping layer 57. The second spacer 55 contacts an upper surface of the capping layer 57.

The gate electrode 67 includes a first electrode 65 and a second electrode 66. The gate electrode 67 may be interpreted as a replacement gate electrode. In an exemplary embodiment, the first gate dielectric layer 61 directly contacts the channel area 29. The first gate dielectric layer 61 may be referred to as an interfacial oxide layer or a chemical oxide layer. The second gate dielectric layer 62 is formed on the first gate dielectric layer 61. The second gate dielectric layer 62 may include silicon oxide, silicon nitride, silicon oxynitride, a high-k dielectric, or a combination thereof. For example, the second gate dielectric layer 62 may include HfO or HfSiO. In an exemplary embodiment, an upper end of the second gate dielectric layer 62 is formed at a higher level than a center of the gate electrode 67. The second gate dielectric layer 62 surrounds a side surface and a bottom of the first electrode 65. The second gate dielectric layer 62 is interposed between the first electrode 65 and the first spacer 37. The first gate dielectric layer 61 is interposed between the channel area 29 and the second gate dielectric layer 62.

According to at least one embodiment of the inventive concept, the first interlayer 42 and the second interlayer 44 function to prevent generation of cracks in the first semiconductor layer 41, the second semiconductor layer 43, and the third semiconductor layer 45.

Figure 2:
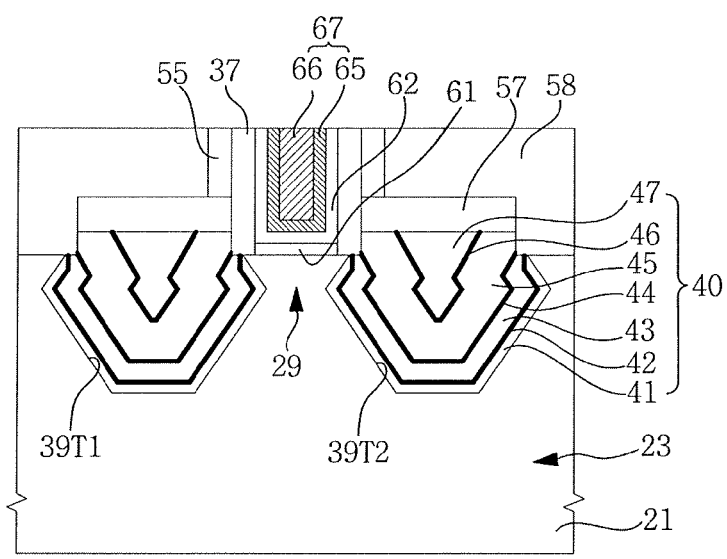

Referring to FIG. 2, a stressor 40 according to an exemplary embodiment is formed in trenches 39T1 and 39T2. The stressor 40 includes a first semiconductor layer 41, a first interlayer 42, a second semiconductor layer 43, a second interlayer 44, a third semiconductor layer 45, a third interlayer 46, and a fourth semiconductor layer 47.

The third interlayer 46 may have a similar configuration to the first interlayer 42 and the second interlayer 44. The fourth semiconductor layer 47 and the third semiconductor layer 45 may be formed using similar methods. In an exemplary embodiment, the second semiconductor layer 43 is thicker than the first semiconductor layer 41. In an exemplary embodiment, the third semiconductor layer 45 is thicker than the second semiconductor layer 43. In an exemplary embodiment, the fourth semiconductor layer 47 is thicker than the third semiconductor layer 45. In an exemplary embodiment, the shape of the second interlayer 44 in the stressor 40 of FIG. 2 is different from the shape of the second interlayer 44 in the stressor 40 of FIG. 1. For example, sidewalls of the second interlayer 44 in FIG. 2 may be shaped like a less than symbol, shaped like a greater than symbol, V-shaped (e.g., sideways), C-shaped, chevron-shaped, include a shape with two straight or substantially straight edges connected together to form the above-described angle, or be shaped like the first interlayer 42 of FIG. 1.

Figure 3:
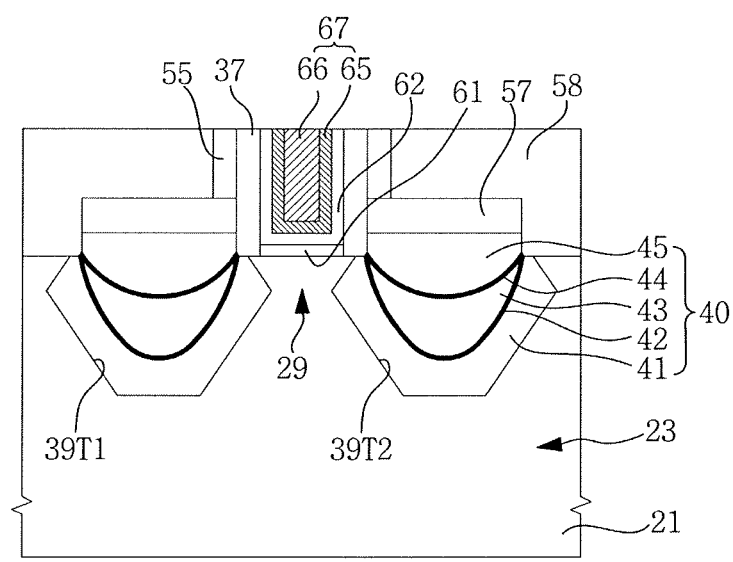

Referring to FIG. 3, a stressor 40 according to an exemplary embodiment includes a first semiconductor layer 41, a first interlayer 42, a second semiconductor layer 43, a second interlayer 44, and a third semiconductor layer 45. In an exemplary embodiment, an upper surface of the first semiconductor layer 41 has a concave shape. In an exemplary embodiment, the first interlayer 42 and the second interlayer 44 have a concave shape. In an exemplary embodiment, a bottom surface of the third semiconductor layer 45 has a convex shape that mates with the concave shape of the second interlayer 44.

Figure 4:
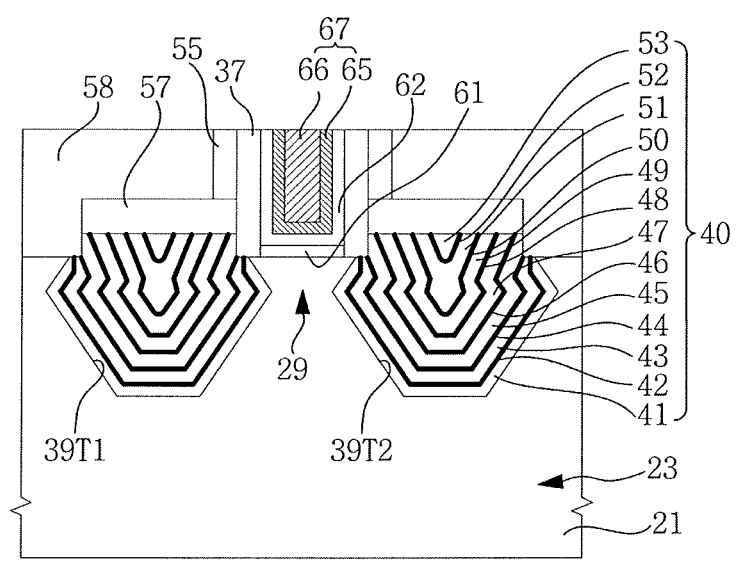

Referring to FIG. 4, a stressor 40 according to an exemplary embodiment is formed in trenches 39T1 and 39T2. The stressor 40 includes a first semiconductor layer 41, a first interlayer 42, a second semiconductor layer 43, a second interlayer 44, a third semiconductor layer 45, a third interlayer 46, a fourth semiconductor layer 47, a fourth interlayer 48, a fifth semiconductor layer 49, a fifth interlayer 50, a sixth semiconductor layer 51, a sixth interlayer 52, and a seventh semiconductor layer 53. In an exemplary embodiment, layers 41-53 of FIG. 4 include side portions shaped like a less than symbol, shaped like a greater than symbol, or with two straight or substantially straight edges connected together to form the above-described angle. In an exemplary embodiment, the seventh semiconductor layer 53 has a concave shape.

Figure 5:
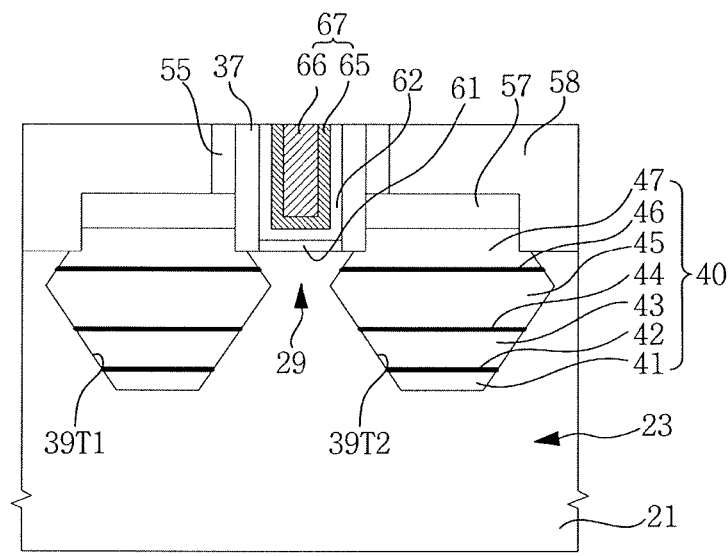

Referring to FIG. 5, a stressor 40 according to an exemplary embodiment of the inventive concept is formed in trenches 39T1 and 39T2. The stressor 40 includes a first semiconductor layer 41, a first interlayer 42, a second semiconductor layer 43, a second interlayer 44, a third semiconductor layer 45, a third interlayer 46, and a fourth semiconductor layer 47. In an exemplary embodiment, a cross-section of the first semiconductor layer 41 and the first interlayer 42 has a trapezoidal shape. In an exemplary embodiment, a cross-section of the second interlayer 44 has a hexagonal shape (e.g., regular or irregular).

The first semiconductor layer 41 is formed on bottoms of the trenches 39T1 and 39T2. In an exemplary embodiment, an upper surface of the first semiconductor layer 41 is horizontal or substantially horizontal. The first interlayer 42 is formed on the first semiconductor layer 41. The second semiconductor layer 43 is formed on the first interlayer 42. In an exemplary embodiment, an upper surface of the second semiconductor layer 43 is horizontal or substantially horizontal. In an exemplary embodiment, the second semiconductor layer 43 is thicker than the first semiconductor layer 41. The second interlayer 44 is formed on the second semiconductor layer 43. The third semiconductor layer 45 is formed on the second interlayer 44. In an exemplary embodiment, an upper surface of the third semiconductor layer 45 is horizontal or substantially horizontal. In an exemplary embodiment, the third semiconductor layer 45 is thicker than the second semiconductor layer 43. The third interlayer 46 is formed on the third semiconductor layer 45. The fourth semiconductor layer 47 is formed on the third interlayer 46.

Figure 6:
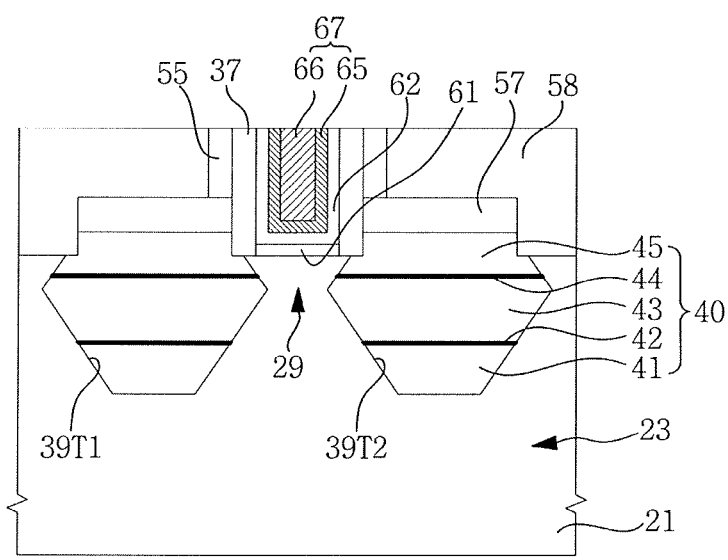

Referring to FIG. 6, a stressor 40 according to an exemplary embodiment includes a first semiconductor layer 41, a first interlayer 42, a second semiconductor layer 43, a second interlayer 44, and a third semiconductor layer 45.

Figure 7:
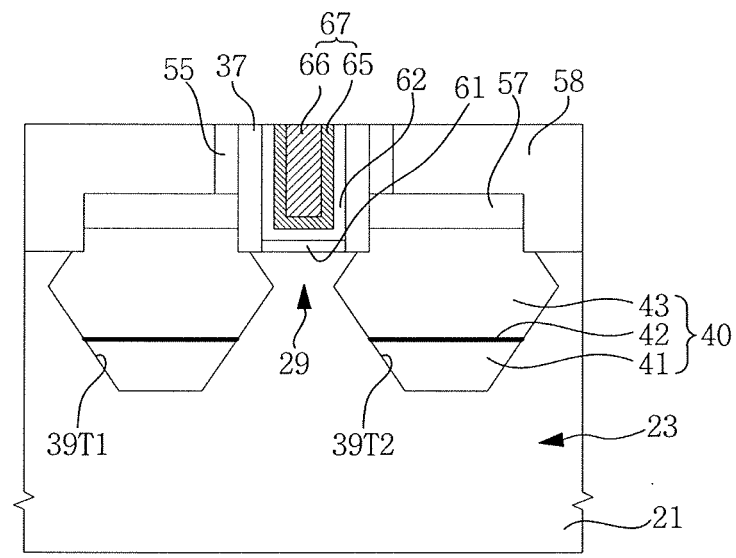

Referring to FIG. 7, a stressor 40 according to an exemplary embodiment includes a first semiconductor layer 41, a first interlayer 42, and a second semiconductor layer 43. In an exemplary embodiment, the second semiconductor layer 43 is thicker than the first semiconductor layer 41.

Figure 8:
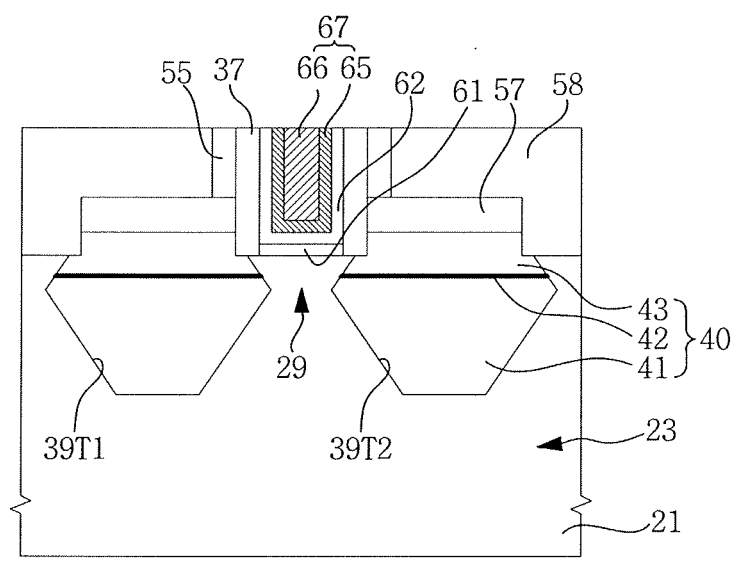

Referring to FIG. 8, a stressor 40 according to an exemplary embodiment includes a first semiconductor layer 41, a first interlayer 42, and a second semiconductor layer 43. In an exemplary embodiment, the second semiconductor layer 43 is thinner than the first semiconductor layer 41.

Figure 9:
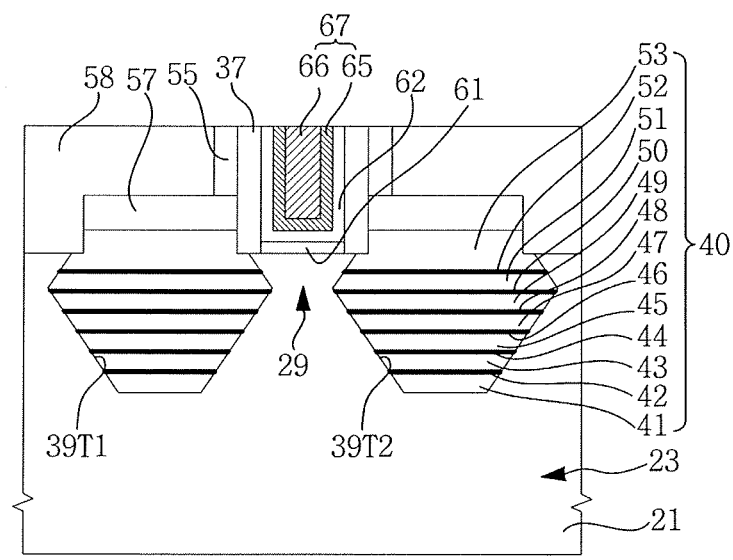

Referring to FIG. 9, a stressor 40 according to an exemplary embodiment includes a first semiconductor layer 41, a first interlayer 42, a second semiconductor layer 43, a second interlayer 44, a third semiconductor layer 45, a third interlayer 46, a fourth semiconductor layer 47, a fourth interlayer 48, a fifth semiconductor layer 49, a fifth interlayer 50, a sixth semiconductor layer 51, a sixth interlayer 52, and a seventh semiconductor layer 53.

Figure 10:
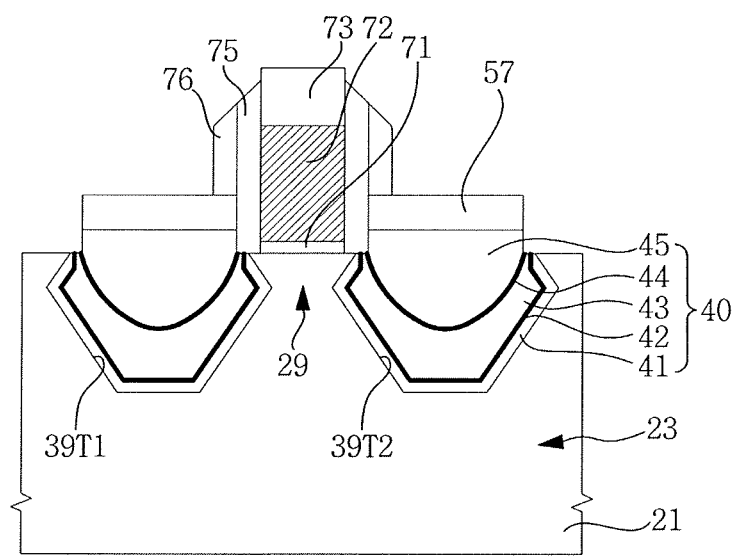

Referring to FIG. 10, a gate dielectric layer 71, a gate electrode 72, and a gate capping pattern 73 are sequentially formed on a channel area 29. A first spacer 75 is formed on side surfaces of the gate dielectric layer 71, the gate electrode 72, and the gate capping pattern 73. A second spacer 76 is formed on an outer side of the first spacer 75. The second spacer 76 contacts an upper surface of the capping layer 57.

FIGS. 11 to 25 are cross-sectional views for describing a method of forming a semiconductor device according to an exemplary embodiment of the inventive concept.

Figure 11:
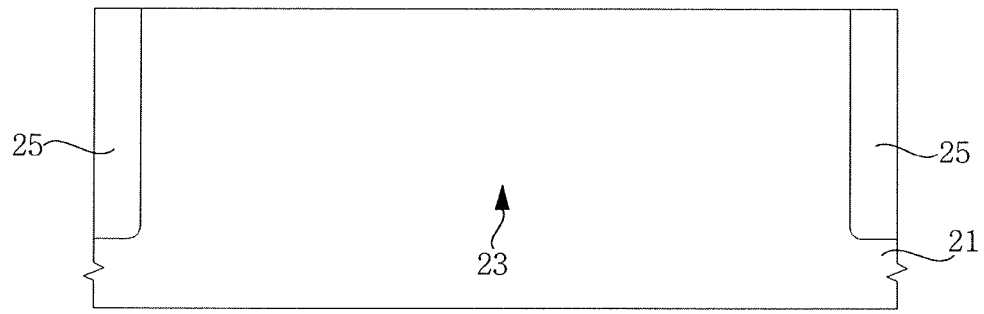
FIGS. 11 to 25 are cross-sectional views for describing a method of forming a semiconductor device according to exemplary embodiments of the inventive concept.

Referring to FIG. 11, device isolation layers 25 defining an active region 23 are formed in a substrate 21.

The substrate 21 may be a semiconductor substrate, such as a single crystalline silicon wafer or a silicon on insulator (SOI) wafer. The active region 23 may be defined in a predetermined region of the substrate 21 by the device isolation layer 25. For example, the active region 23 may include single crystalline silicon containing n-type impurities. The device isolation layers 25 may include silicon oxide, silicon nitride, silicon oxynitride, or a combination thereof. The device isolation layers 25 may be formed using a shallow trench isolation (STI) method.

Figure 12:
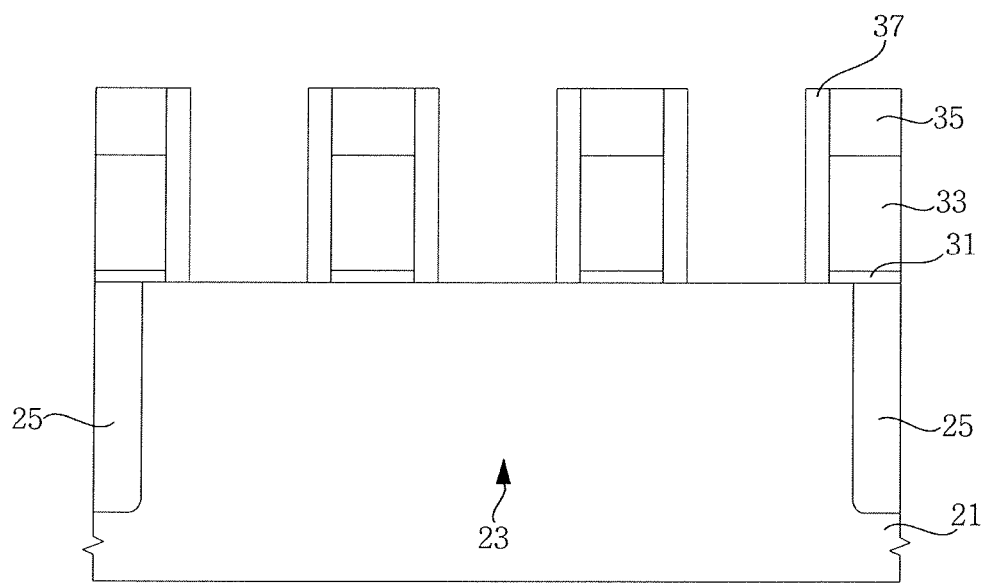

Referring to FIG. 12, a preliminary gate dielectric layer 31, a preliminary gate electrode 33, a preliminary capping pattern 35, and a first spacer 37 are formed on the active region 23.

The preliminary gate dielectric layer 31, the preliminary gate electrode 33, and the preliminary capping pattern 35 may be formed using a plurality of thin-film formation processes and patterning processes. The first spacer 37 may be formed using a thin-film formation process and an anisotropic etching process. Side surfaces of the preliminary gate dielectric layer 31, the preliminary gate electrode 33, and the preliminary capping pattern 35 may be vertically aligned. The preliminary gate dielectric layer 31 contacts the active region 23 and the device isolation layer 25. The preliminary gate electrode 33 is formed on the preliminary gate dielectric layer 31. The preliminary capping pattern 35 covers the preliminary gate electrode 33. The first spacer 37 covers the side surfaces of the preliminary gate dielectric layer 31, the preliminary gate electrode 33, and the preliminary capping pattern 35.

The preliminary gate dielectric layer 31 may include silicon oxide, silicon nitride, silicon oxynitride, or a combination thereof. For example, the preliminary gate dielectric layer 31 may be silicon oxide. The preliminary gate electrode 33 may include a material having an etch selectivity with respect to the active region 23, the preliminary gate dielectric layer 31, and the preliminary capping pattern 35. For example, the preliminary gate electrode 33 may be polysilicon. The preliminary capping pattern 35 may include silicon oxide, silicon nitride, silicon oxynitride, or a combination thereof. For example, the preliminary capping pattern 35 may include silicon nitride. The first spacer 37 may include silicon oxide, silicon nitride, silicon oxynitride, or a combination thereof. For example, the first spacer 37 may include silicon nitride.

Figure 13:
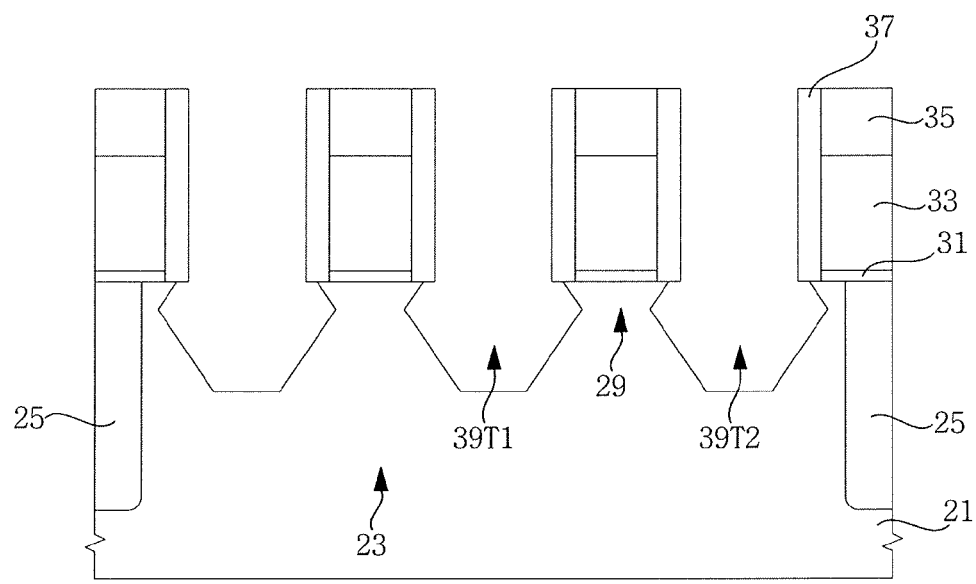

Referring to FIG. 13, trenches 39T1 and 39T2 are formed by partially removing the active region 23 using the preliminary gate electrode 33, the preliminary capping pattern 35, and the first spacer 37 as an etch mask. The trenches 39T1 and 39T2 may include a first trench 39T1 and a second trench 39T2. A channel area 29 may be defined between the first trench 39T1 and the second trench 39T2. The channel area 29 may be a portion of the active region 23. In an exemplary embodiment, the channel area 29 includes single crystalline silicon having n-type impurities.

Sidewalls of the trenches 39T1 and 39T2 may have a < or > shape, shaped like a less than symbol, shaped like a greater than symbol, V-shaped (e.g., sideways), C-shaped, chevron-shaped, or may include two straight or substantially edges connected together to form the above-described angle. The sidewalls of the trenches 39T1 and 39T2 may be interpreted as having a convergence interface. The trenches 39T1 and 39T2 may be formed using an anisotropic etching process, an isotropic etching process, a directional etching process, or a combination thereof. The trenches 39T1 and 39T2 may be aligned with an outer side of the preliminary gate electrode 33.

In an exemplary embodiment, the channel area 29 includes single crystalline silicon having p-type impurities.

Figure 14:
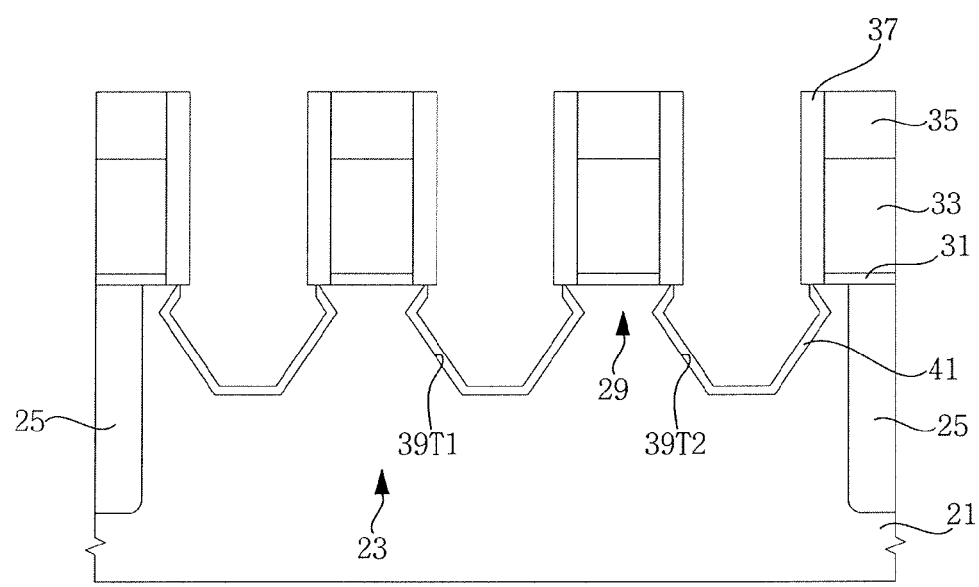

Referring to FIG. 14, a first semiconductor layer 41 is formed in the trenches 39T1 and 39T2. In an exemplary embodiment, the first semiconductor layer 41 is conformally formed on inner walls of the trenches 39T1 and 39T2. A side surface of the first semiconductor layer 41 may have a < or > shape, may be shaped like a less than symbol, may be shaped like a greater than symbol, V-shaped (e.g., sideways), C-shaped, chevron-shaped, or may include two straight or substantially straight edges connected to form the above-described angle. In an exemplary embodiment, the first semiconductor layer 41 directly contacts the inner walls of the trenches 39T1 and 39T2.

The first semiconductor layer 41 may include a crystal growth material. For example, the first semiconductor layer 41 may be formed by an SEG method. In an exemplary embodiment, the first semiconductor layer 41 includes a different material from the channel area 29. In an exemplary embodiment, the first semiconductor layer 41 includes a different element from the channel area 29. In an exemplary embodiment, the first semiconductor layer 41 includes a material having a different lattice constant from the channel area 29. For example, the first semiconductor layer 41 may include a material having a greater lattice constant than the channel area 29. For example, the first semiconductor layer 41 may include undoped SiGe formed by an SEG method.

In an exemplary embodiment, a content of Ge in the first semiconductor layer 41 may be in the range of 20% to 80%. For example, the content of Ge in the first semiconductor layer 41 may be in the range of 20% to 30%.

Figure 15:
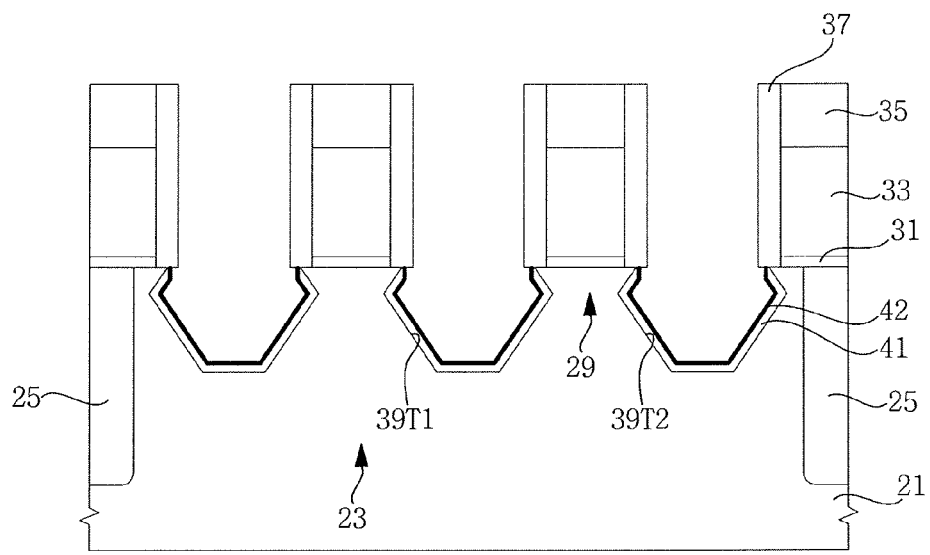

Referring to FIG. 15, a first interlayer 42 is formed on the first semiconductor layer 41. In an exemplary embodiment, the first interlayer 42 is conformally formed on surfaces of the first semiconductor layer 41. A side surface of the first interlayer 42 may include a < or > shape, may be shaped like a less than symbol, may be shaped like a greater than symbol, V-shaped (e.g., sideways), C-shaped, chevron-shaped, or may include two straight or substantially straight edges connected together to form the above-described angle. In an exemplary embodiment, the first interlayer 42 directly contacts the first semiconductor layer 41. In an exemplary embodiment, the first interlayer 42 is thinner than the first semiconductor layer 41. In an exemplary embodiment, the first interlayer 42 has a thickness in the range of 0.1 nm to 10 nm. For example, the first interlayer 42 may have a thickness in the range of 1 nm to 2 nm.

In an exemplary embodiment, the first interlayer 42 includes a different material from the first semiconductor layer 41. In an exemplary embodiment, the first interlayer 42 includes a different element from the first semiconductor layer 41. The first interlayer 42 may include a pseudomorphic monolayer, a pseudomorphic multilayer, a pseudomorphic dot-like structure, or a combination thereof, having a different bandgap from the first semiconductor layer 41. The first interlayer 42 may include SiN, SiO, CN, SiCN, GaN, AlN, InN, GaAs, SiC, Ge, Si, a Si/Ge superlattice, or a combination thereof. The Si/Ge superlattice may include a structure in which silicon layers and Ge layers are alternately grown in two to 100 layers. The first interlayer 42 may be formed using an SEG method, a chemical vapor deposition (CVD) method, or a combination thereof. The first interlayer 42 may include a crystal growth material.

Figure 16:
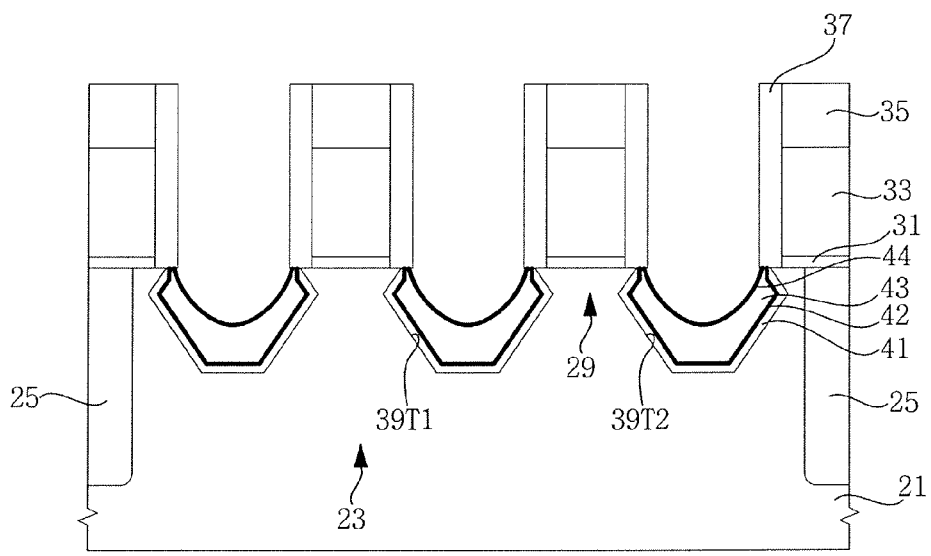

Referring to FIG. 16, a second semiconductor layer 43 is formed on the first interlayer 42. A second interlayer 44 is formed on the second semiconductor layer 43.

In an exemplary embodiment, the second semiconductor layer 43 directly contacts the first interlayer 42. In an exemplary embodiment, an upper surface of the second semiconductor layer 43 has a concave shape. In an exemplary embodiment, the second semiconductor layer 43 is thicker than the first semiconductor layer 41. The second semiconductor layer 43 may include a crystal growth material. For example, the second semiconductor layer 43 may be formed by an SEG method. In an exemplary embodiment, the second semiconductor layer 43 includes a different material from the channel area 29. In an exemplary embodiment, the second semiconductor layer 43 includes a different element from the channel area 29. In an exemplary embodiment, the second semiconductor layer 43 may include a material having a different lattice constant from the channel area 29. For example, the second semiconductor layer 43 may include a material having a greater lattice constant than the channel area 29.

For example, the second semiconductor layer 43 may include B-doped SiGe formed using an SEG method. In an exemplary embodiment, a content of Ge in the second semiconductor layer 43 is higher than that in the first semiconductor layer 41. In an exemplary embodiment, the content of Ge in the second semiconductor layer 43 is in the range of 20% to 80%. For example, the content of Ge in the second semiconductor layer 43 may be in the range of 30% to 50%.

The second interlayer 44 and the first interlayer 42 may be formed using similar methods. In an exemplary embodiment, the second interlayer 44 is conformally formed on surfaces of the second semiconductor layer 43. In an exemplary embodiment, the second interlayer 44 directly contacts the second semiconductor layer 43. In an exemplary embodiment, the second interlayer 44 is thinner than the second semiconductor layer 43. In an exemplary embodiment, the second interlayer 44 has a thickness in the range of 0.1 nm to 10 nm. For example, the second interlayer 44 may have a thickness in the range of 1 nm to 2 nm.

In an exemplary embodiment, the second interlayer 44 includes a different material from the second semiconductor layer 43. In an exemplary embodiment, the second interlayer 44 includes a different element from the second semiconductor layer 43. The second interlayer 44 may include a pseudomorphic monolayer, a pseudomorphic multilayer, a pseudomorphic dot-like structure, or a combination thereof, having a different bandgap from the second semiconductor layer 43. The second interlayer 44 may include SiN, SiO, CN, SiCN, GaN, AlN, InN, GaAs, SiC, Ge, Si, a Si/Ge superlattice, or a combination thereof. The Si/Ge superlattice may include a structure in which silicon layers and Ge layers are alternately grown in two to 100 layers. The second interlayer 44 may be formed by an SEG method, a chemical vapor deposition (CVD) method, or a combination thereof. The second interlayer 44 may include a crystal growth material.

Figure 17:
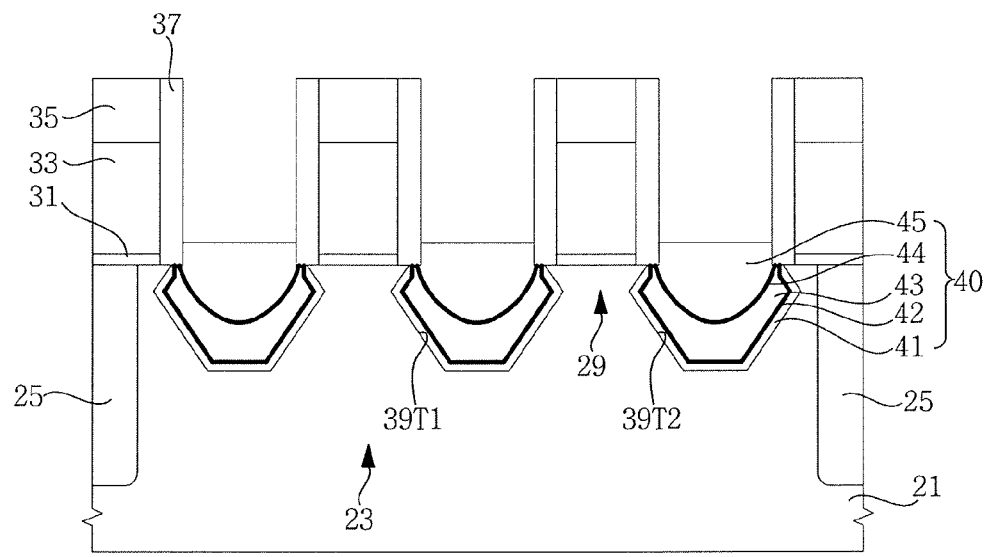

Referring to FIG. 17, a third semiconductor layer 45 is formed on the second interlayer 44. A stressor 40 according to an exemplary embodiment includes the first semiconductor layer 41, the first interlayer 42, the second semiconductor layer 43, the second interlayer 44, and the third semiconductor layer 45.

In an exemplary embodiment, the third semiconductor layer 45 directly contacts the second interlayer 44. In an exemplary embodiment, the third semiconductor layer 45 is thicker than the second semiconductor layer 43. In an exemplary embodiment, the third semiconductor layer 45 completely fills the trenches 39T1 and 39T2, and protrudes from the trenches 39T1 and 39T2. An upper end of the third semiconductor layer 45 may be formed at a higher level than an upper end of the channel area 29. The third semiconductor layer 45 contacts a side surface of the first spacer 37. The third semiconductor layer 45 may include a crystal growth material. For example, the third semiconductor layer 45 may be formed by an SEG method. In an exemplary embodiment, the third semiconductor layer 45 includes a different material from the channel area 29. In an exemplary embodiment, the third semiconductor layer 45 includes a different element from the channel area 29. In an exemplary embodiment, the third semiconductor layer 45 includes a material having a different lattice constant from the channel area 29. For example, the third semiconductor layer 45 may include a material having a greater lattice constant than the channel area 29.

For example, the third semiconductor layer 45 may include B-doped SiGe formed by an SEG method. In an exemplary embodiment, a content of Ge in the third semiconductor layer 45 is higher than that in the first semiconductor layer 41. In an exemplary embodiment, the content of Ge in the third semiconductor layer 45 is higher than that in the first semiconductor layer 41 and that in the second semiconductor layer 43. In an exemplary embodiment, the content of Ge in the third semiconductor layer 45 is in the range of 20% to 80%. For example, the content of Ge in the third semiconductor layer 45 may be in the range of 30% to 50%.

Figure 18:
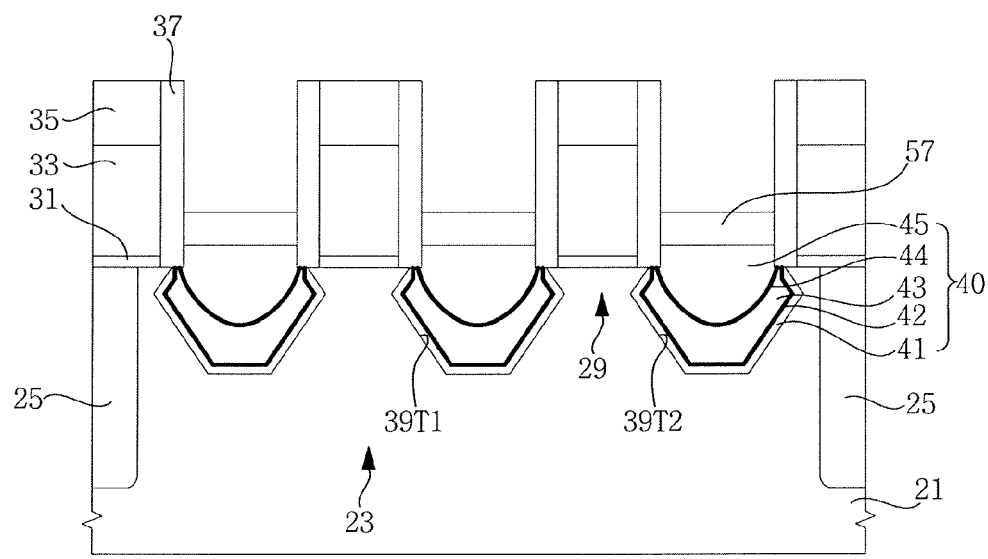

Referring to FIG. 18, a capping layer 57 is formed on the stressor 40. The capping layer 57 contacts the side surface of the first spacer 37. The capping layer 57 may include Si, SiGe, a metal silicide, or a combination thereof. The capping layer 57 may be interpreted as an ohmic layer.

For example, the capping layer 57 may include B-doped single crystalline Si formed by an SEG method. The capping layer 57 may include B-doped SiGe formed by an SEG method. A content of Ge in the capping layer 57 may be lower than that in the third semiconductor layer 45. In an exemplary embodiment, the content of Ge in the capping layer 57 is 10% or less.

Figure 19:
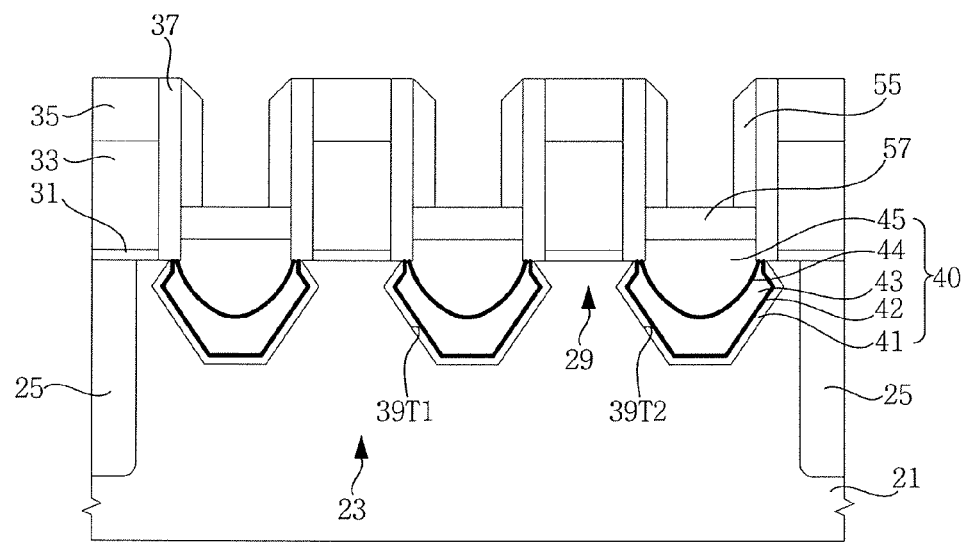

Referring to FIG. 19, a second spacer 55 is formed on an outer side of the first spacer 37. The second spacer 55 may be formed by a thin-film formation process and an anisotropic etching process. The second spacer 55 contacts an upper surface of the capping layer 57. The second spacer 55 may include silicon oxide, silicon nitride, silicon oxynitride, or a combination thereof. For example, the second spacer 55 may be silicon nitride.

Figure 20:
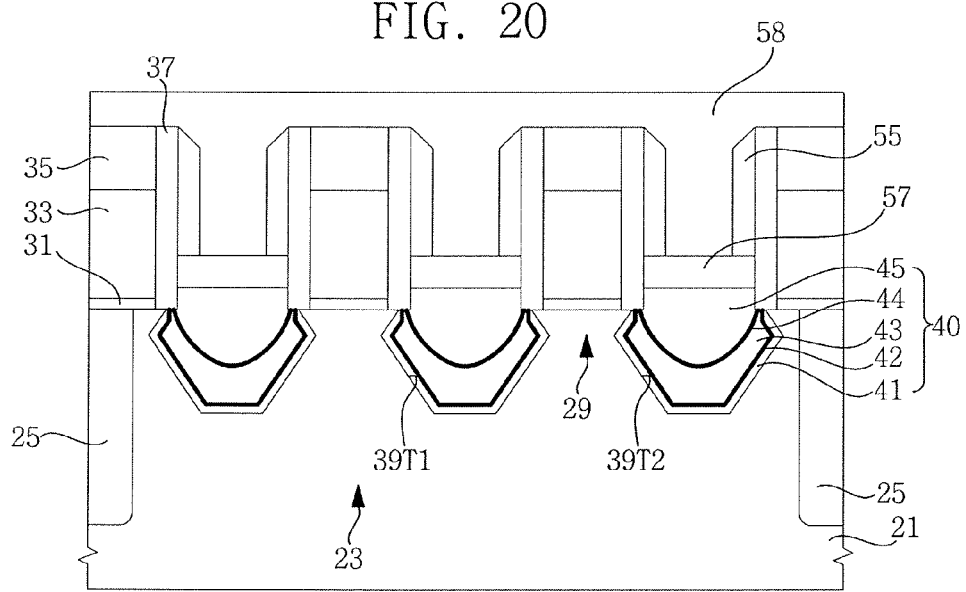

Referring to FIG. 20, a lower insulating layer 58 covering the entire surface of the substrate 21 may be formed. The lower insulating layer 58 may contact an upper surface of the capping layer 57. The lower insulating layer 58 may include silicon oxide, silicon nitride, silicon oxynitride, or a combination thereof. For example, the lower insulating layer 58 may be silicon oxide. In an exemplary embodiment, the lower insulating layer 58 covers and contacts all the preliminary capping patterns 35, all the first spacers 37, all the second spacers 55, and all the capping layers 57.

Figure 21:
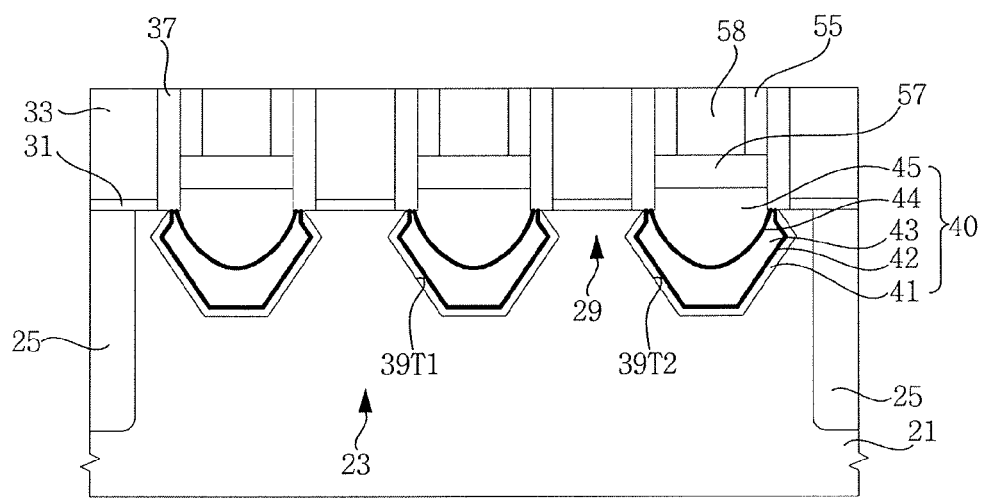

Referring to FIG. 21, the preliminary capping pattern 35 is removed to expose the preliminary gate electrode 33. The preliminary gate electrode 33 may be exposed by a chemical mechanical polishing (CMP) process, an etch-back process, or a combination thereof.

Figure 22:
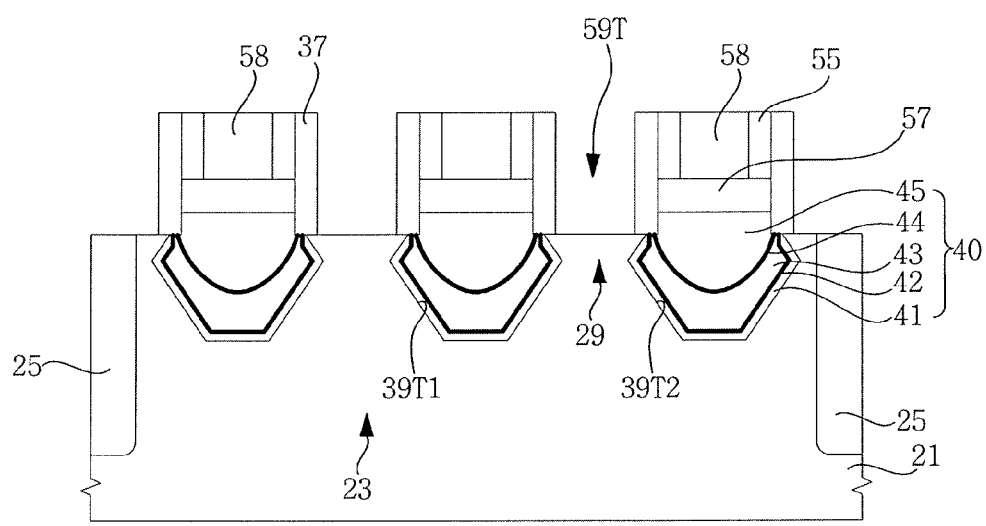

Referring to FIG. 22, the preliminary gate electrode 33 and the preliminary gate dielectric layer 31 are removed to form a gate trench 59T. The channel area 29 is exposed at a bottom of the gate trench 59T.

Figure 23:
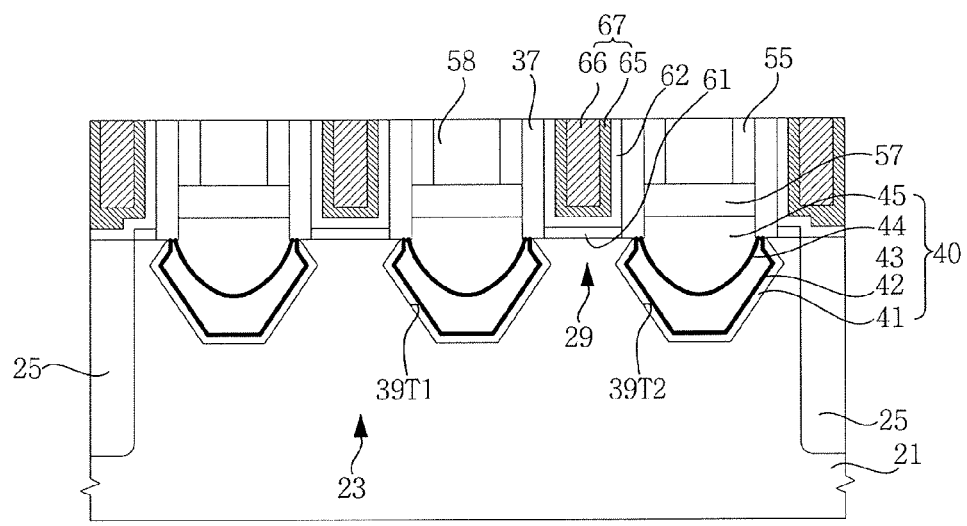

Referring to FIG. 23, a first gate dielectric layer 61, a second gate dielectric layer 62, and a gate electrode 67 are formed in the gate trench 59T. The gate electrode 67 includes a first electrode 65 and a second electrode 66.

In an exemplary embodiment, the first gate dielectric layer 61 directly contacts the channel area 29. The first gate dielectric layer 61 may be referred to as an interfacial oxide layer or a chemical oxide layer. The first gate dielectric layer 61 may be formed by a cleaning process. For example, the first gate dielectric layer 61 may include silicon oxide formed by a chemical reaction between Si and $H_2O_2$.

The second gate dielectric layer 62 is formed on the first gate dielectric layer 61. The second gate dielectric layer 62 may include silicon oxide, silicon nitride, silicon oxynitride, a high-k dielectric, or a combination thereof. For example, the second gate dielectric layer 62 may include HfO or HfSiO. The second gate dielectric layer 62 surrounds a side surface and a bottom of the first electrode 65. The first gate dielectric layer 61 is interposed between the channel area 29 and the second gate dielectric layer 62.

The first electrode 65 surrounds a side surface and a bottom of the second electrode 66. The first electrode 65 may include a conductive layer in consideration of a work-function. The first electrode 65 may include TiN, TaN, TiAl, or TiAlC. The second electrode 66 may include a metal layer, a metal silicide layer, a conductive carbon layer, a polysilicon layer, or a combination thereof. For example, the second electrode 66 may include W.

The second gate dielectric layer 62 and the gate electrode 67 may be formed using a plurality of thin-film formation processes and planarization processes. The planarization processes may include a CMP process, an etch-back process, or a combination thereof. Upper surfaces of the lower insulating layer 58, the first spacer 37, the second spacer 55, the second gate dielectric layer 62, and the gate electrode 67 may be exposed on the same plane.

Figure 24:
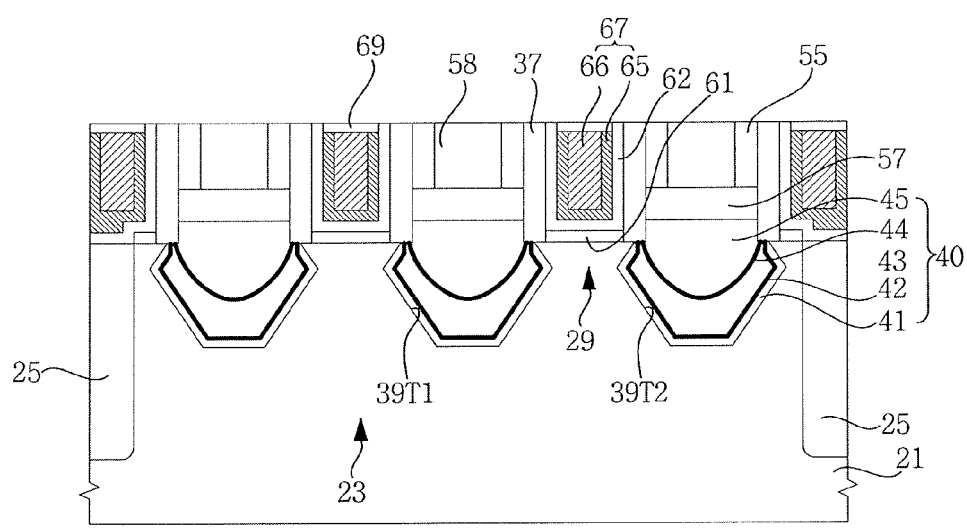

Referring to FIG. 24, a gate capping pattern 69 is formed on the gate electrode 67. The formation of the gate capping pattern 69 may include a process of recessing the gate electrode 67, a thin-film formation process, and a planarization process. The planarization process may include a CMP process, an etch-back process, or a combination thereof. The gate capping pattern 69 may include silicon oxide, silicon nitride, silicon oxynitride, or a combination thereof. For example, the gate capping pattern 69 may include silicon nitride. Upper surfaces of the gate capping pattern 69, the lower insulating layer 58, the first spacer 37, the second spacer 55, and the second gate dielectric layer 62 may be exposed on the same plane.

Figure 25:
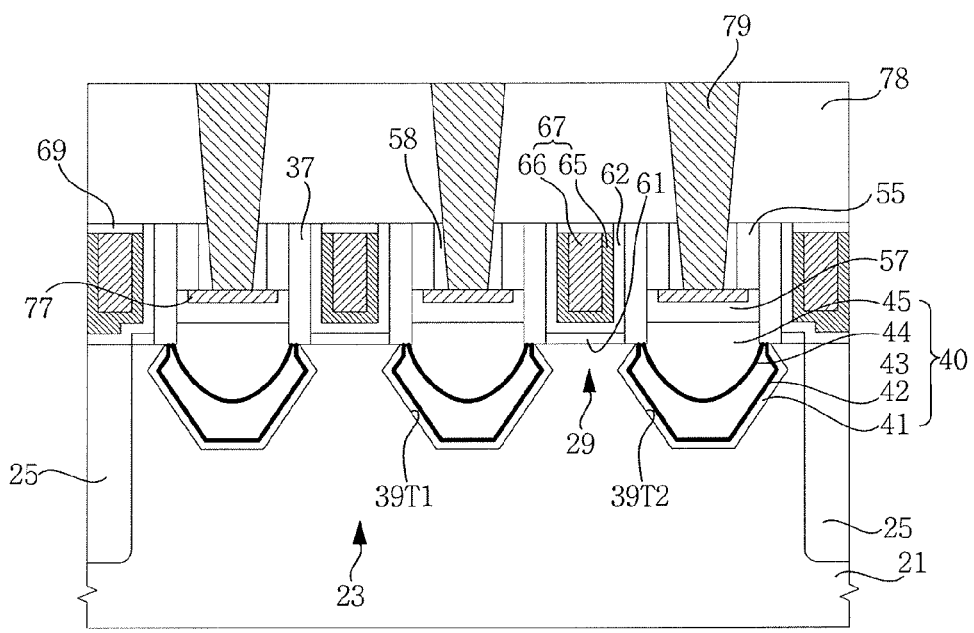

Referring to FIG. 25, an upper insulating layer 78 is formed on the gate capping pattern 69, the lower insulating layer 58, the first spacer 37, the second spacer 55, and the second gate dielectric layer 62. A metal silicide layer 77 is formed on the capping layer 57. A contact plug 79 passing through the upper insulating layer 78 and the lower insulating layer 58 to contact the metal silicide layer 77 is formed.

The upper insulating layer 78 may include silicon oxide, silicon nitride, silicon oxynitride, or a combination thereof. For example, the upper insulating layer 78 may include silicon oxide. The contact plug 79 may include a metal layer, a metal silicide layer, a conductive carbon layer, a polysilicon layer, or a combination thereof.

Figure 26:
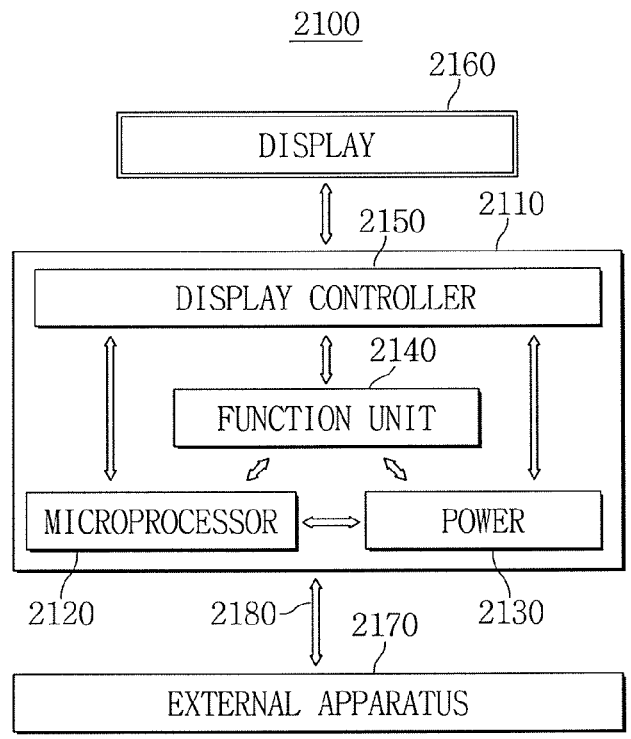
FIGS. 26 and 27 are system block diagrams illustrating electronic apparatuses according to exemplary embodiments of the inventive concept.
Figure 27:
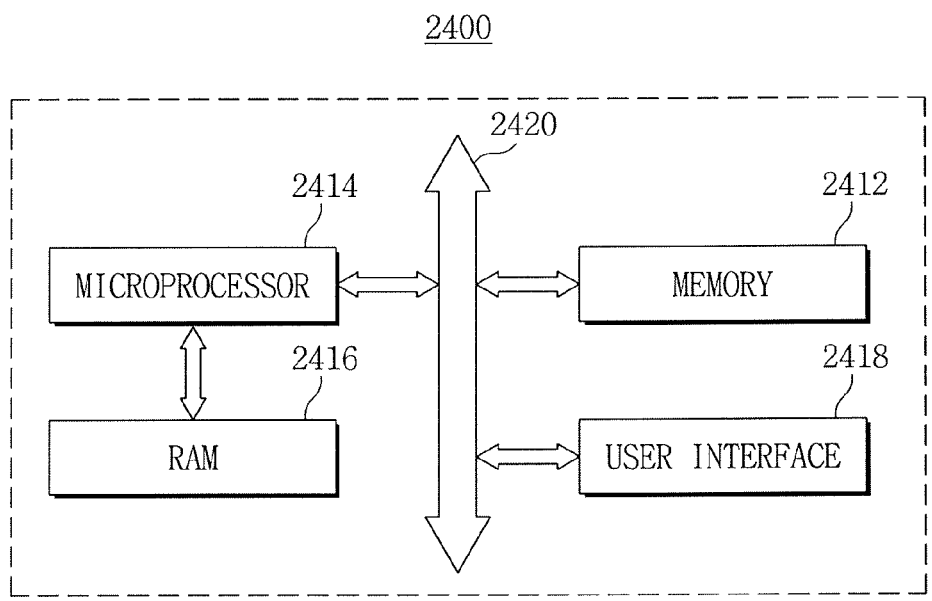

FIGS. 26 and 27 are system block diagrams illustrating electronic apparatuses according to exemplary embodiments of the inventive concept.

Referring to FIG. 26, the semiconductor device described with reference to FIGS. 1 to 25 is applied to an electronic system 2100. The electronic system 2100 includes a body 2110, a microprocessor 2120, a power supply unit 2130, a function unit 2140, and a display controller 2150. The body 2110 may be a motherboard formed on a printed circuit board (PCB). The microprocessor 2120, the power supply unit 2130, the function unit 2140, and the display controller 2150 may be installed on the body 2110. A display 2160 may be disposed inside or outside of the body 2110. For example, the display 2160 may be disposed on a surface of the body 2110 and display an image processed by the display controller 2150.

The power supply unit 2130 may receive a constant voltage from an external battery, etc., divide the voltage into various levels of required voltages, and supply those voltages to the microprocessor 2120, the function unit 2140, and the display controller 2150, etc. The microprocessor 2120 may receive a voltage from the power supply unit 2130 to control the function unit 2140 and the display 2160. The function unit 2140 may perform various functions of the electronic system 2100. For example, when the electronic system 2100 is a smartphone, the function unit 2140 may have several components, which perform functions of a mobile phone such as output of an image to the display 2160 or output of an audio signal (e.g., a voice) to a speaker, by dialing or communication with an external apparatus 2170. When a camera is installed, the function unit 2140 may function as a camera image processor.

In an embodiment to which the inventive concept is applied, when the electronic system 2100 is connected to a memory card, etc. in order to expand a capacity thereof, the function unit 2140 may be a memory card controller. The function unit 2140 may exchange signals with the external apparatus 2170 through a wired or wireless communication unit 2180. For example, the body 2110 may include a transceiver to exchange the signals wirelessly with the external apparatus 2170. Further, when the electronic system 2100 needs a Universal Serial Bus (USB), etc. in order to expand functionality, the function unit 2140 may serve as an interface controller. Further, the function unit 2140 may include a mass storage apparatus.

The semiconductor device described with reference to FIGS. 1 to 25 may be applied to the function unit 2140 or the microprocessor 2120. For example, the microprocessor 2120 or the function unit 2140 may include the stressor 40. For example, a transistor within the microprocessor 2120 or the function unit 2140 may include the stressor 40.

Referring to FIG. 27, an electronic system 2400 includes at least one of the semiconductor devices described above according to an exemplary embodiment of the inventive concept. The electronic system 2400 may be used to fabricate a mobile apparatus or a computer. For example, the electronic system 2400 may include a memory system 2412, a microprocessor 2414, a random access memory (RAM) 2416, a bus 2420, and a user interface 2418. The microprocessor 2414, the memory system 2412, and the user interface 2418 may be interconnected via the bus 2420. The user interface 2418 may be used to input data to or output data from the electronic system 2400. The microprocessor 2414 may program and control the electronic system 2400. The RAM 2416 may be used as an operational memory of the microprocessor 2414. The microprocessor 2414, the RAM 2416, and/or other components may be assembled in a single package. The memory system 2412 may store codes for operating the microprocessor 2414, data processed by the microprocessor 2414, or external input data. The memory system 2412 may include a controller and a memory device. In an exemplary embodiment, the memory 2412 is the 3D memory array, and one or more transistors included in the 3D memory array include the stressor 40.

The semiconductor device described with reference to FIGS. 1 to 25 may be applied to the microprocessor 2414, the RAM 2416, and the memory system 2412.

According to at least one embodiment of the inventive concept, a stressor is formed in a semiconductor substrate disposed adjacent to both sides of a gate electrode. The stressor may include a plurality of semiconductor layers and interlayers interposed between the semiconductor layers. The interlayers may include a pseudomorphic thin film having a different bandgap from the semiconductor layers. The interlayers may function to prevent generation of cracks in the semiconductor layers. Accordingly, a semiconductor device having excellent electrical characteristics may be implemented.

The foregoing is illustrative of exemplary embodiments of the inventive concept and is not to be construed as limiting thereof. Although a few exemplary embodiments have been described, those skilled in the art will readily appreciate that many modifications are possible without materially departing from the inventive concept. For example, the inventive concept may be expansively applied to a multi-gate transistor, a finFET, a nanowire transistor, a vertical NAND string, or a three-dimensional transistor.

What is claimed is:

1. A semiconductor device, comprising:
    a substrate comprising a first trench and a second trench, wherein the trenches are spaced apart from each other, and a channel area is defined between the trenches;
    a gate dielectric layer disposed on the channel area;
    a gate electrode disposed on the gate dielectric layer; and
    a stressor including a plurality of semiconductor layers formed in the first trench and the second trench and a plurality of interlayers formed between the semiconductor layers,
    wherein the interlayers have a different bandgap than that of the semiconductor layers,
    wherein a lowermost one of the semiconductor layers is undoped with impurity, and
    wherein the other semiconductor layers on the lowermost one of the semiconductor layers are doped with impurity.

2. The semiconductor device of claim 1, wherein a content of Ge in each of the other semiconductor layers is higher than that in the lowermost one of the semiconductor layers.

3. The semiconductor device of claim 1, further comprising:
    a capping layer disposed on the stressor;
    a first spacer disposed on a side surface of the gate dielectric layer; and
    a second spacer contacting the first spacer and disposed on an upper surface of the capping layer covering the stressor.

4. The semiconductor device of claim 1, wherein the gate dielectric layer is in contact with a bottom or a sidewall of the gate electrode, and an upper end of the gate dielectric layer is formed at a higher level than a center of the gate electrode.

5. The semiconductor device of claim 1, wherein the interlayers include a pseudomorphic monolayer, a pseudomorphic multilayer, or a combination thereof.

6. The semiconductor device of claim 1, wherein the interlayers include SoN, SiO, CN, SiCN, GaN, AlN, InN, GaAs, SiC, Ge, Si, a Si/Ge superlattice, or a combination thereof.

7. The semiconductor device of claim 1,
    wherein the semiconductor layers comprise first, second, and third semiconductor layers,
    wherein the interlayers comprises first and second interlayers,
    wherein, for each of the first trench and the second trench, the first semiconductor layer is in contact with sidewalls of the trench,
    wherein the first interlayer is disposed on the first semiconductor layer,
    wherein the second semiconductor layer is disposed on the first interlayer,
    wherein the second interlayer is disposed on the second semiconductor layer, and
    wherein the third semiconductor layer is disposed on the second interlayer.

8. The semiconductor device of claim 7, wherein sidewalls of the first semiconductor layer and the first interlayer are v-shaped.

9. The semiconductor device of claim 7, wherein the first interlayer is thinner than the first semiconductor layer.

10. The semiconductor device of claim 7, wherein the first interlayer has a thickness in a range from 0.1 am to 10 nm.

11. The semiconductor device of claim 7, wherein the second semiconductor layer is thicker than the first semiconductor layer.

12. A semiconductor device, comprising:
a substrate comprising a first trench and a second trench, wherein the trenches are spaced apart from each other, and a channel area is defined between the trenches;
a gate dielectric layer disposed on the channel area;
a gate electrode disposed on the gate dielectric layer; and
a stressor including a plurality of semiconductor layers formed in the first trench and the second trench and a plurality of interlayers formed between the semiconductor layers,
wherein a lowermost one of the semiconductor layers is undoped with impurity, and
wherein the other semiconductor layers on the lowermost one of the semiconductor layers are doped with impurity.

13. The semiconductor device of claim 12, further comprising:
a capping layer disposed on the stressor;
a first spacer disposed on a side surface of the gate dielectric layer; and
a second spacer contacting the first spacer and disposed on an upper surface of the capping layer covering the stressor.

14. The semiconductor device of claim 12, wherein the gate dielectric layer is in contact with a bottom or a sidewall of the gate electrode, and an upper end of the gate dielectric layer is formed at a higher level than a center of the gate electrode.

15. The semiconductor device of claim 12, wherein the interlayers include a pseudomorphic monolayer, a pseudomorphic multilayer, or a combination thereof.

16. The semiconductor device of claim 12, wherein the interlayers include SoN, SiO, CN, SiCN, GaN, AlN, InN, GaAs, SiC, Ge, Si, a Si/Ge superlattice, or a combination thereof.

17. The semiconductor device of claim 12,
wherein the semiconductor layers comprise first, second, and third semiconductor layers,
wherein the interlayers comprises first and second interlayers,
wherein, for each of the first trench and the second trench, the first semiconductor layer is in contact with sidewalls of the trench,
wherein the first interlayer is disposed on the first semiconductor layer,
wherein the second semiconductor layer is disposed on the first interlayer,
wherein the second interlayer is disposed on the second semiconductor layer, and
wherein the third semiconductor layer is disposed on the second interlayer.

18. The semiconductor device of claim 17, wherein sidewalls of the first semiconductor layer and the first interlayer are v-shaped.

19. The semiconductor device of claim 17, wherein the first interlayer is thinner than the first semiconductor layer.

20. The semiconductor device of claim 17, wherein the first interlayer has a thickness in a range from 0.1 nm to 10 nm.

21. The semiconductor device of claim 17, wherein the second semiconductor layer is thicker than the first semiconductor layer.

* * * * *